(12) United States Patent  
Kleveland et al.

(10) Patent No.: US 7,212,454 B2
(45) Date of Patent: May 1, 2007

(54) METHOD AND APPARATUS FOR PROGRAMMING A MEMORY ARRAY

(75) Inventors: Bendik Kleveland, Santa Clara, CA (US); Tae Hee Lee, Saratoga, CA (US); Seung Geon Yu, San Ramon, CA (US); Chia Yang, San Jose, CA (US); Feng Li, San Jose, CA (US); Xiaoyu Yang, Campbell, CA (US)

(73) Assignee: SanDisk 3D LLC, Sunnyvale, CA (US)

( * ) Notice: Subject to any disclaimer, the term of this patent is extended or adjusted under 35 U.S.C. 154(b) by 140 days.

(21) Appl. No.: 11/158,396

(22) Filed: Jun. 22, 2005

(65) Prior Publication Data

US 2006/0291303 A1    Dec. 28, 2006

(51) Int. Cl.
*G11C 29/00*    (2006.01)
(52) U.S. Cl. ................................ 365/200; 365/175
(58) Field of Classification Search ............... 365/200, 365/175, 105
See application file for complete search history.

(56) References Cited

U.S. PATENT DOCUMENTS

| | | | |
|---|---|---|---|
| 4,646,266 A | 2/1987 | Ovshinsky et al. |
| 5,130,777 A | 7/1992 | Galbraith et al. |
| 5,278,839 A | 1/1994 | Matsumoto et al. |
| 5,313,425 A | 5/1994 | Lee et al. |
| 5,432,729 A | 7/1995 | Carson et al. |
| 5,469,450 A | 11/1995 | Cho et al. |
| 5,498,979 A | 3/1996 | Parlour et al. |
| 5,579,265 A | 11/1996 | Devin |
| 5,642,318 A | 6/1997 | Knaack et al. |
| 5,701,267 A | 12/1997 | Masuda et al. |
| 5,708,667 A | 1/1998 | Hayashi |

(Continued)

FOREIGN PATENT DOCUMENTS

GB    2 265 031    9/1993

OTHER PUBLICATIONS

"A 16Mb Mask ROM with Programmable Redundancy," Nsruka et al., ISSCC 1989/Session 10: Nonvolatile Memories/Paper THAM 10.1, 2 pages, Feb. 16, 1989.

(Continued)

*Primary Examiner*—Gene N. Auduong
(74) *Attorney, Agent, or Firm*—Brinks Hofer Gilson & Lione (57) ABSTRACT

A method and apparatus for programming a memory array are disclosed. In one embodiment, after each word line is programmed, an attempt is made to detect a defect on that word line. If a defect is detected, the word line is repaired with a redundant word line. The word lines are then reprogrammed and rechecked for defects. In another embodiment, after each word line is programmed, an attempt is made to detect a defect on that word line. If a defect is detected, that word line is repaired along with a previously-programmed adjacent word line. In yet another embodiment, after each word line is programmed, an attempt is made to detect a defect on that word line and a previously-programmed adjacent word line. If a defect is detected on that word line, that word line and the previously-programmed adjacent word line are repaired with redundant word lines.

19 Claims, 5 Drawing Sheets

U.S. PATENT DOCUMENTS

| | | | |
|---|---|---|---|
| 5,748,545 A * | 5/1998 | Lee et al. | 365/201 |
| 5,751,647 A | 5/1998 | O'Toole | |
| 5,757,700 A | 5/1998 | Kobayashi | |
| 5,784,391 A | 7/1998 | Konigsburg | |
| 5,796,694 A | 8/1998 | Shirane | |
| 5,831,989 A | 11/1998 | Fujisaki | |
| 5,835,396 A | 11/1998 | Zhang | |
| 5,835,509 A | 11/1998 | Sako et al. | |
| 5,872,790 A | 2/1999 | Dixon | |
| 5,909,049 A | 6/1999 | McCollum | |
| 5,920,502 A | 7/1999 | Noda et al. | |
| 5,943,254 A | 8/1999 | Bakeman, Jr. et al. | |
| 5,986,950 A | 11/1999 | Joseph | 365/200 |
| 6,016,269 A | 1/2000 | Peterson et al. | |
| 6,026,476 A | 2/2000 | Rosen | |
| 6,034,882 A | 3/2000 | Johnson et al. | |
| 6,055,180 A | 4/2000 | Gudesen et al. | |
| 6,185,122 B1 | 2/2001 | Johnson et al. | |
| 6,205,564 B1 | 3/2001 | Kim et al. | 714/48 |
| 6,216,247 B1 | 4/2001 | Creta et al. | |
| 6,236,587 B1 | 5/2001 | Gudesen et al. | |
| 6,407,953 B1 | 6/2002 | Cleeves et al. | |
| 6,420,215 B1 | 7/2002 | Knall et al. | |
| 6,438,044 B2 | 8/2002 | Fukuda | 365/200 |
| 6,446,242 B1 | 9/2002 | Lien et al. | |
| 6,462,988 B1 | 10/2002 | Harari | |
| 6,487,749 B1 | 12/2002 | Tsui | |
| 6,498,749 B1 | 12/2002 | Cuppens et al. | |
| 6,515,923 B1 | 2/2003 | Cleeves | |
| 6,525,953 B1 | 2/2003 | Johnson | |
| 6,545,501 B1 | 4/2003 | Bailis et al. | |
| 6,567,287 B2 | 5/2003 | Scheuerlein | |
| 6,574,145 B2 | 6/2003 | Kleveland et al. | |
| 6,591,394 B2 | 7/2003 | Lee et al. | |
| 6,597,595 B1 | 7/2003 | Ichiriu et al. | |
| 6,658,438 B1 | 12/2003 | Moore et al. | |
| 6,661,730 B1 | 12/2003 | Scheuerlein et al. | |
| 6,728,126 B1 | 4/2004 | Issaq et al. | |
| 6,728,149 B2 * | 4/2004 | Akamatsu | 365/200 |
| 6,868,022 B2 | 3/2005 | Scheuerlein et al. | |
| 2002/0028541 A1 | 3/2002 | Lee et al. | |
| 2002/0085431 A1 | 7/2002 | Jeon et al. | 365/200 |
| 2002/0162062 A1 | 10/2002 | Hughes et al. | 714/723 |
| 2003/0021176 A1 | 1/2003 | Hogan | 365/230.06 |
| 2003/0115514 A1 | 6/2003 | Ilkbahar et al. | |
| 2003/0115518 A1 | 6/2003 | Kleveland et al. | |
| 2003/0120858 A1 | 6/2003 | March et al. | |
| 2004/0100831 A1 | 5/2004 | Johan et al. | |
| 2004/0255089 A1 | 12/2004 | Unno | 711/154 |
| 2005/0044459 A1 | 2/2005 | Scheuerlein et al. | |
| 2005/0078537 A1 | 4/2005 | So et al. | |

OTHER PUBLICATIONS

"Circuit Technologies for 16 Mb DRAMs," Mano et al., ISSCC 1987/Session 1: MEGABIT DRAMs/Paper WAM 1.6, 2 pages, Feb. 27, 1987.

"Memory Device and Method for Storing and Reading Data in a Write-Once Memory Array," U.S. Appl. No. 09/877,720, filed Jun. 8, 2001; inventors: Christopher S. Moore, James E. Schneider, J. James Tringali and Roger W. March.

"Memory Device and Method for Storing and Reading a File System Structure in a Write-Once Memory Array," U.S. Appl. No. 09/877,719, filed Jun. 8, 2001; inventors: Christopher S. Moore, James E. Schneider, J. James Tringali and Roger W. March.

"Method for Reading Data in a Write-Once Memory Device Using a Write-Many File System," U.S. Appl. No. 09/818,138, filed Jun. 8, 2001; inventors: J. James Tringali, Christopher S. Moore, Roger W. March, James E. Schneiger, Derek Bosch, and Daniel C. Steere.

"Method for Re-Directing Data Traffic in a Write-Once Memory Device," U.S. Appl. No. 09/877,691, filed Jun. 8, 2001; inventors: James J. Tringali, Christopher S. Moore, Roger W. March, James E. Schneider, Derek Bosch, and Daniel C. Steere.

"Method for Making a Write-Once Memory Device Read Compatible with a Write-Many File System," U.S. Appl. No. 10/023,468, filed Dec. 14, 2001; inventors: Christopher S. Moore, Matt Fruin, Colm Lysaght, and Roy E. Scheuerlein.

"Reed-Solomon Codes: An introduction to Reed-Solomon Codes: principles, architecture and implementation," http://www.4i2i.com/reed solomon codes.htm, 8 pages.

"TP 9.2: A 30ns 64Mb DRAM with Build-in-Self-Test and Repair Function," ISSCC 92 Session 9/Non-Volatile and Dynamic Rams/Paper 9.2, 2 pages, 1992.

"64M x 8 Bit, 32M x 16 Bit NAND Flash Memory," Samsung Electronics, 39 pages.

"Exotic memories, diverse approaches," 8 pages, www.ednasia.com, Sep. 2001.

"A Vertical Leap for Microchips: Engineers have discovered a way to pack more computing power into microcircuits: build them vertically as well as horizontally," Thomas H. Lee, 8 pages.

"Three-Dimensional Memory Array and Method of Fabrication," U.S. Appl. No. 09/560,626, filed Apr. 28, 2000; inventors: Johan Knall.

Zhang et al., "On-state reliability of amorphous silicon antifuses," IEDM Digest of Technical Papers, pp. 551-554, 1995.

Shih et al., "Characterization and modeling of a highly reliable metal-to-metal antifuse for high-performance and high-density field-programmable gate arrays," Proceedings of IEEE, Int. Reliability Physics Synp., 1997, pp. 25-33.

"Method and Apparatus for Improving Yield in Semiconductor Devices at Guaranteeing Health of Redundancy Information," U.S. Appl. No. 11/024,516, filed Dec. 28, 2004, Inventors: Alper Ilkbahar and Derek J. Bosch.

International Search Report and Written Opinion for PCT/US2006/023107, 12 pages, Nov. 17, 2006.

* cited by examiner

| Page0, wordline A |
|---|
|  |
|  |
|  |

| Redundant Row, wordline RR0 |
|---|
| Redundant Row, wordline RR1 |
|  |

Figure 3A

| Page0, wordline A |
|---|
| → Bad row – use RR0 |
|  |
|  |

| Page 1, wordline B |
|---|
| Redundant Row, wordline RR1 |
|  |

Figure 3B

| Page0, wordline A |
|---|
| → Bad row – use RR0 |
| Page2, wordline C |
| Page3, wordline D |
| Page4, wordline E |

| Page 1, wordline B |
|---|
| Redundant Row, wordline RR1 |
|  |

Figure 3C

| → Bad row – use RR1 |
|---|
| → Bad row – use RR0 |
| Page2, wordline C |
| Page3, wordline D |
| Page4, wordline E |

| Page 1, wordline B |
|---|
| Page 0, wordline A |
|  |

Figure 3D

| Page0, wordline A |
|---|
|  |
|  |
|  |
|  |

110 b)

| Redundant Row, wordline RR0 |
|---|
| Redundant Row, wordline RR1 |
|  |

| Page0, wordline A |
|---|
| → Bad row – use RR0 |
|  |
|  |
|  |

110

| Page 1, wordline B |
|---|
| Redundant Row, wordline RR1 |
|  |

| → Bad row – use RR1 |
|---|
| → Bad row – use RR0 |
|  |
|  |
|  |

110

| Page 1, wordline B |
|---|
| Page 0, wordline A |
|  |

| → Bad row – use RR1 |
|---|
| → Bad row – use RR0 |
| Page2, wordline C |
| Page3, wordline D |
| Page4, wordline E |

110

| Page 1, wordline B |
|---|
| Page 0, wordline A |
|  |

METHOD AND APPARATUS FOR PROGRAMMING A MEMORY ARRAY

BACKGROUND

Memory cells, such as antifuse one-time-programmable (OTP) memory cells, can contain leakage paths that are activated after programming of all the memory cells in a memory array. The activation of leakage paths can be caused by several mechanisms. For example, a leakage path can be caused by a defect that resides in a location that is not electrically visible until the rupture of the antifuse. Once the antifuse is ruptured and a filament is formed, this defect can provide a short circuit between two word lines, between two bit lines, or between a word line and a bit line. A leakage path can also be caused by a slight change in the reverse leakage of programmed memory cells. Even though the memory cells are not selected for read, the unselected reverse leakage adds to the off-current leakage and may trigger an incorrect read of memory cells. A leakage path can also be caused by a slight change in the leakage of weak defects induced by local heating or electromigration during the high-voltage programming. This change can be sufficient to locally either reduce the read voltage or read current during a memory read, causing the incorrect value to be read out. One commonality in each of these mechanisms is that the problem cannot always be detected during the programming of any particular bit but can be detected after programming several bits of the memory array.

SUMMARY

The present invention is defined by the following claims, and nothing in this section should be taken as a limitation on those claims.

By way of introduction, the preferred embodiments described below provide a method and apparatus for programming a memory array. In one preferred embodiment, word lines in a memory array are programmed. After each word line is programmed, an attempt is made to detect a defect on that word line. If a defect is detected, the word line is repaired with a redundant word line. The word lines are then reprogrammed and rechecked for defects. In another preferred embodiment, after each word line is programmed, an attempt is made to detect a defect on that word line. If a defect is detected, that word line is repaired along with a previously-programmed adjacent word line. In yet another preferred embodiment, after each word line is programmed, an attempt is made to detect a defect on that word line and a previously-programmed adjacent word line. If a defect is detected on that word line, that word line and the previously-programmed adjacent word line are repaired with redundant word lines. Other preferred embodiments are provided, and each of the preferred embodiments described herein can be used alone or in combination with one another.

The preferred embodiments will now be described with reference to the attached drawings.

DETAILED DESCRIPTION OF THE PRESENTLY PREFERRED EMBODIMENTS

Figure 1:
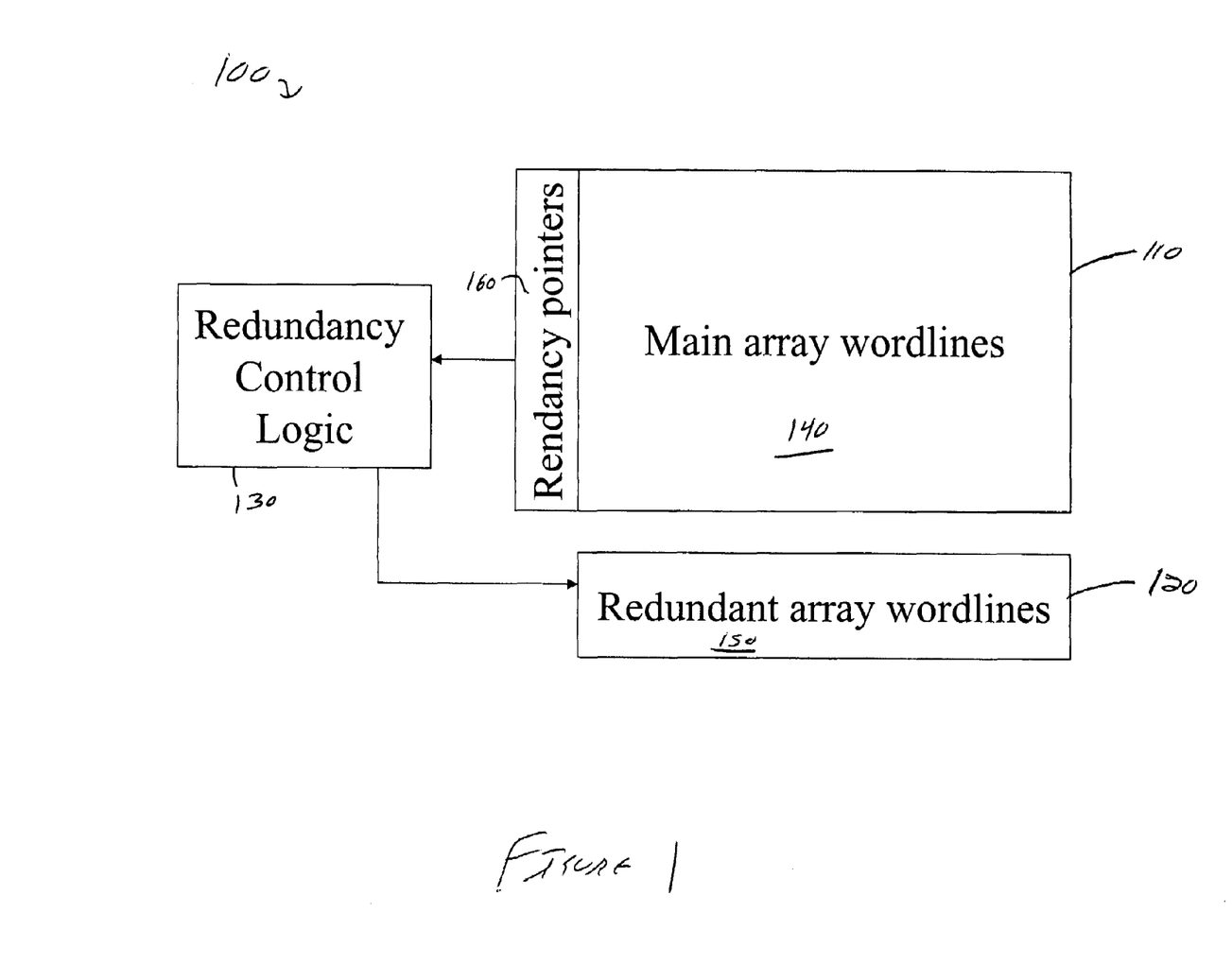
FIG. 1 is a block diagram of a memory device of a preferred embodiment.

FIG. 1 is a block diagram of a memory device 100 of a preferred embodiment. The memory device 100 comprises a main memory array 110, a redundant memory array 120, and redundancy control logic 130 coupled with the main memory array 110 and the redundant memory array 120. The main and redundant memory arrays 110, 120 each comprise respective word lines 140, 150 and bit lines (not shown), and memory cells are formed at the crossing of word lines 140, 150 and bit lines in each memory array 110, 120. The main memory array 110, 120 also comprises redundancy pointers 160, which are used by the redundancy control logic 130. While shown as separate arrays in FIG. 1, the main and redundant memory arrays 110, 120 can be integrated in a single memory array. In one preferred embodiment, the memory device takes the form of a modular, compact, handheld unit, such as a memory card or stick, that comprises an external electrical connector that can be coupled with a host device, such as a digital camera, digital audio player, or other portable consumer product.

The main and redundant memory arrays 110, 120 each comprise a plurality of memory cells. The memory cells can take any suitable form and can be write-once (i.e., one-time programmable), write-many, or few-time programmable. The memory cells can be organized in a single layer (i.e., a two-dimensional array) or in a plurality of layers stacked vertically above one another above a single silicon substrate (i.e., a three-dimensional array), as described in U.S. Pat. No. 6,034,882 to Johnson et al. and U.S. Pat. No. 6,420,215 to Knall et al., both of which are assigned to the assignee of the present invention and are hereby incorporated by reference. While the memory cells preferably comprise a semiconductor material, other materials can be used, such as, but not limited to, phase-change materials and amorphous solids as well as those used with MRAM and organic passive element arrays, as described in U.S. Pat. No. 6,055,180, which is hereby incorporated by reference. It is important to note that the following claims should not be read as requiring a specific type of memory device (e.g., write-once or write-many) or specific type of memory array (e.g., two dimensional or three-dimensional) unless explicitly recited therein. An antifuse memory cell, which comprises a series capacitor and diode, will be used to illustrate these preferred embodiments. In the unprogrammed state, the antifuse memory cell does not conduct current, as no current passes through the capacitor. However, when programmed, a filament is formed by breaking down the capacitor, and, in the programmed state, the antifuse memory cell conducts current through the filament.

As described in the background section, a defect can occur in the main memory array 110. As used herein, a "defect" refers to any mechanism that results in the activation of a leakage path that can trigger an incorrect read of a memory cell. Defects include, but are not limited to, defects that reside in a location that is not electrically visible until the rupture of an antifuse in an antifuse memory cell, a defect that results in unselected reverse leakage adding to off-current leakage and triggering an incorrect read of a memory cell, and a defect induced by local heating or electromigration during the high-voltage programming.

Figure 2:
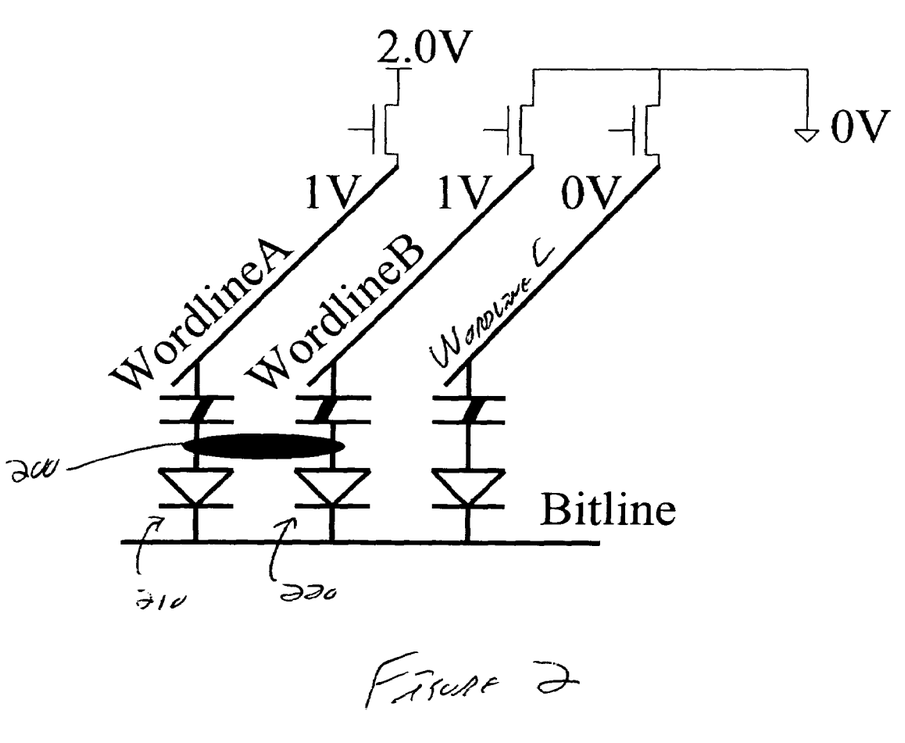
FIG. 2 is an illustration showing the effect of a defect in two adjacent word lines.

FIG. 2 shows a plurality of word lines (word line A, word line B, word line C), and a defect (shown by oval 200) between two memory cells 210, 220. Word line A is adjacent to word line B, which is adjacent to word line C. Because of this physical arrangement, the defect 200 lies on adjacent word lines A and B. It should be noted that, although the defect is shown in the memory cells (between the capacitor and the diode), this document will refer to the defect as being on word lines A and B (or that word lines A and B comprise the defect) since the defect can result in the activation of a leakage path that can trigger an incorrect read of memory cells along those word lines. The defect 200 can cause incorrect data to be read from the memory cells 210, 220 since, after memory cells 210, 220 are programmed, the defect 200 shorts word line A with word line B. When an attempt is made to read the memory cell 210 on word line A, a read voltage of 2V, for example, is applied to word line A, while the other word lines are kept at 0V, for example. Because of the short caused by the defect 200, word line A will not get the full 2V (despite the fact that it is being driven to 2V) due to the fighting with adjacent word line B. As shown in FIG. 2, the short results in a reduced voltage of 1V (instead of 2V) on word line A and an increased voltage of 1V (instead of 0V) on word line B. The intermediate voltage of 1V may not be enough to conduct current in all bits along word line A, and the memory cell 210 along word line A can be read as being unprogrammed instead of programmed. At the same time, the intermediate voltage of 1V on word line B may be enough to cause data on word line B to be accidentally read instead of the data on word line A.

The redundancy control logic 130 in FIG. 1 can be used to repair main array word lines 140 that have a defect with redundant array word lines 150 in the redundant array 120. (It should be noted that the on-the-fly redundancy scheme provided by the redundancy control logic 130 can be used to detect other types of errors as well (i.e., error not caused by "defects").) In this embodiment, each main array word line 140 in the main array 110 can store redundancy pointers 160 to assign that word line 140 to a corresponding word line 150 in the redundant array 120. Main array word lines 140 marked as bad during production sort or found to be bad during programming can be replaced with a word line 150 in the redundant array 120 by writing a redundancy pointer 160 that points to a row in the redundant array 120. It should be noted that the redundant array word lines 150 can be associated with the main array word lines 140 in any desired manner, such as by using direct mapping, set-associative mapping, or fully-associative mapping algorithms, for example.

In operation, the redundancy control logic 130 detects whether a defect is present on a word line 140 that has been programmed in the main array 110. If a defect is detected on that word line 140, the word line 140 is repaired with a word line 150 in the redundant array 120. A word line 140 in the main array 110 is "repaired" when a substitute word line 150 in the redundant array 120 takes its place. A redundancy pointer 160 is stored in a location in the main array 110 associated with the bad word line 140. When the memory address of the bad word line 140 is received in conjunction with a read or write operation, the redundancy pointer 160 associated with that word line 140 is read and points the redundancy control logic 130 to the repaired word line 150 in the redundant array 120. U.S. Pat. No. 6,868,022, U.S. Patent Application No. US 2003-0115518 A1, and U.S. patent application Ser. No. 11/024,516, which are all assigned to the assignee of the present invention and are hereby incorporated by reference, provide additional information on preferred and alternate redundancy schemes.

Various mechanisms can be used to attempt to detect a defect on a word line. In one embodiment, information is written to the main memory 110 on a page-by-page basis, and the redundancy control logic 130 comprises a page buffer. (For simplicity, this document will assume that each word line can store one page of information. Of course, other organization schemes can be used.) In operation, after each word line in the main array 110 is programmed with the information stored in the page buffer, the word line is read back, and the information stored in the word line is compared with the information stored in the page buffer. A mismatch between the information read back from the word line and the information stored in the page buffer indicates that a defect (or some other type of error) is present on the word line. As described above, if a defect is detected on a word line in the main array 110, that word line is repaired with a redundant word line in the redundant array 120, and the appropriate redundancy pointer 160 is written in the main array 110. (As mentioned above, instead of or in addition to marking a word line as bad during programming (i.e., "on-the-fly redundancy"), a word line can be marked as bad during production sort.)

One difficulty associated with detecting a defect that affects multiple word lines is that the defect may only be detectable after at least two of those word lines are programmed. Take, for example, the defect 200 shown in FIG. 2, where the defect 200 on word line A can only be observed after word line B is programmed. Before programming either word line A or B, the defect 200 does not affect word line A or B and cannot be detected because it is on the other side of the capacitor (i.e., both bits appear to be open circuits irrespective of the defect 200). After word line A is programmed, the defect 200 still cannot be detected because the capacitor of the unprogrammed memory cell 220 on word line B does not allow the defect 200 to short word line A with word line B. However, after word line B is programmed, the situation in FIG. 2 appears, and the short-circuit problem discussed above arises.

The redundancy control logic 130 can be designed in such a way to address this situation. One embodiment uses a "two-pass" programming solution. In general, consider a memory array having first and second word lines (the terms "first" and "second" are being used generically and do not necessarily refer to the very first and second word lines in the memory array), wherein the first word line comprises a defect that is detectable only after the second word line is programmed (as with word lines A and B in the above example). After each word line is programmed, an attempt is made to detect a defect on that word line, and, if a defect is detected, that word line is repaired with a redundant word line. This is considered the first programming pass. A second programming pass is performed, repeating the above acts. Since the second word line has already been programmed in the first programming pass, when the first word line is reprogrammed in the second programming pass, the defect in the first word line is detected, and the first word line is repaired. This embodiment will be illustrated further in conjunction with FIGS. 3A–3D.

FIGS. 3A–3D show a sequence of programming steps as pages 0–4 are programmed into word lines A–E under a two-pass programming scheme. In each of the two passes, after each word line is programmed with a page of information, the page of information is read back from the word line and compared with information stored in the page buffer. A mismatch indicates a defect (or some other type of error), and a repair operation is performed. It should be noted that while a programming pass in this example covers five word line, a programming pass can contain fewer or greater number of word lines. For example, a programming pass can include only two word lines or all of the word lines in the memory array.

Figure 3A:
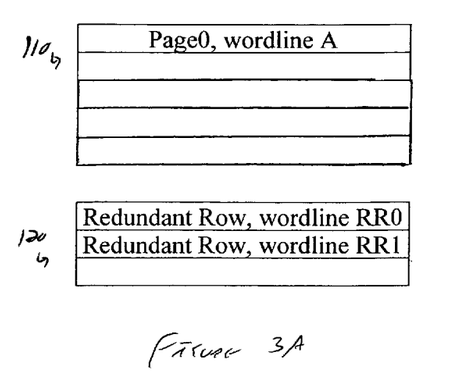
FIGS. 3A–3D are illustrations of a two-pass programming technique of a preferred embodiment.
Figure 3B:
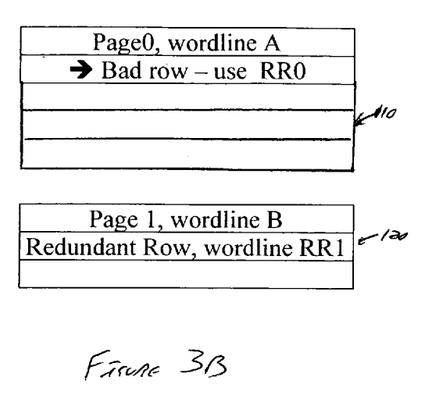
Figure 3C:
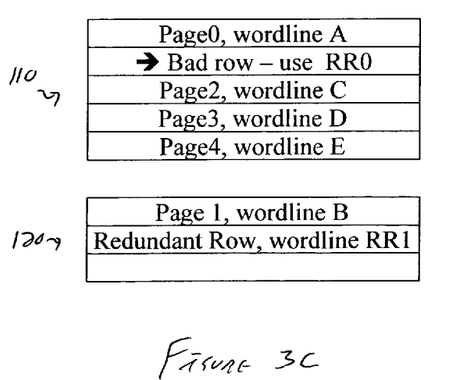

FIG. 3A is an illustration of the main and redundant memory arrays 110, 120 (with a defect in word lines A and B, as described above) after a page of information (page 0) is programming into word line A during the first pass of programming. Although word line A contains a defect, it cannot be detected because word line B has not yet been programmed. In other words, the short that would allow the defect on word line A to be detected has not yet been created. Accordingly, when information is read out of word line A, it will match the information stored in the page register (assuming no other error occurs). Next, page 1 is programmed into word line B (see FIG. 3B). Now that word lines A and B are both programmed, a short is created between those two word lines. A defect is detected when the information read out of word line B does not match the information stored in the page register for word line B, and word line B is repaired by programming page 1 into a word line in the redundant array 120. A redundancy pointer 160 that points to the word line in the redundant array 120 is programmed in the main array 110. The first pass programming operation continues with pages 2, 3, and 4 being successfully programmed into word lines C, D, and E, respectively, in the main array 110 (see FIG. 3C). The first pass programming operation then ends. Although word line B is now repaired, page 0 in word line A is now corrupted.

Figure 3D:
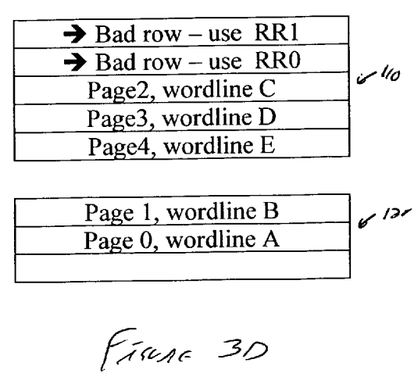

After the first pass programming operation ends, a second pass programming operation begins, repeating the acts described above. However, this time, after page 0 is programmed into word line A, a defect is detected because of the short that now exists between word lines A and B (but did not exist the first time word line A was programmed). In response to the defect being detected, word line A is repaired by programming page 0 into a word line in the redundant array 120, and the appropriate redundancy pointer 160 is programmed in the main array 110. The second pass programming operation continues and ends after page 4 is programmed in word line E. Accordingly, the defect on word line B was detected and word line B was repaired during the first programming pass, while the defect on word line A was detected and the word line A was repaired during the second programming pass.

Figure 4A:
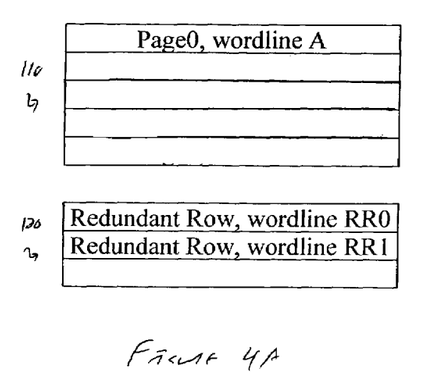
FIGS. 4A–4D are illustrations of a programming technique of a preferred embodiment in which, if a defect is detected on a given word line, that word line and a previously-programmed adjacent word line are repaired.
Figure 4B:
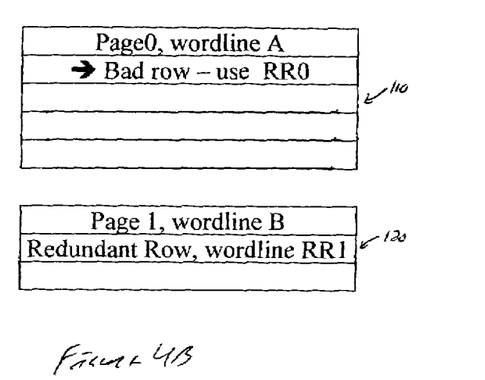
Figure 4C:
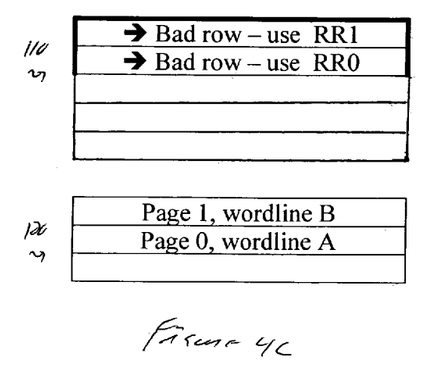
Figure 4D:
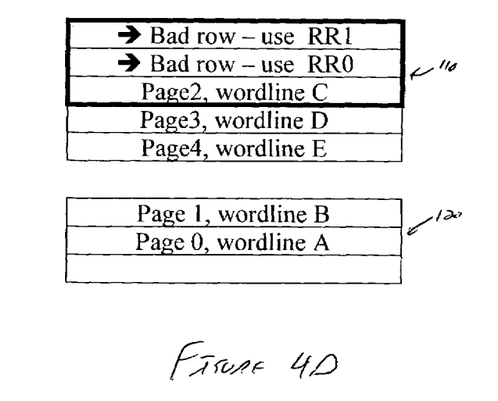

FIGS. 4A–4D illustrate another embodiment. As in the embodiment described above in conjunction with FIGS. 3A–3D, a plurality of main array word lines 140 are programmed, and, after each word line 140 is programmed, an attempt is made to detect a defect on that word line. However, in this embodiment, if a defect is detected on a given word line, not only is that word line repaired with a redundant word line 150, but so is the previously-programmed adjacent word line. Turning now to FIG. 4A, page 0 is programmed into word line A. As in FIG. 3A, even though word line A contains a defect, it cannot be detected because word line B has not yet been programmed to create the short between word lines A and B. Programming continues in FIG. 4B with page 1 being programmed into word line B. Now that both word lines A and B are programmed, the defect in word line B is detected, and word line B is repaired using a redundant array word line 150. In this embodiment, the redundancy control logic 130 also repairs word line A using a redundant array word line 150, as shown in FIG. 4C. The programming operation then continues with pages 2, 3, and 4 being successfully programmed into word lines C, D, and E, respectively, in the main array 110 (see FIG. 4D).

As can be seen by this illustration, this embodiment reduces the bandwidth overhead of doing a complete two-pass programming by avoiding the reprogramming of word lines that do not contain a defect. In other words, this embodiment achieves both high-quality and high-bandwidth programming by reprogramming only the word line that fails first pass programming and the previously-programmed adjacent word line. (In an alternate embodiment, if a defect is detected on a given word line (e.g., word line B), not only is that word line (e.g., word line B) and the previously-programmed adjacent word line (e.g., word line A) repaired, but so is the yet-to-be-programmed adjacent word line (e.g., word line C).)

Figure 5A:
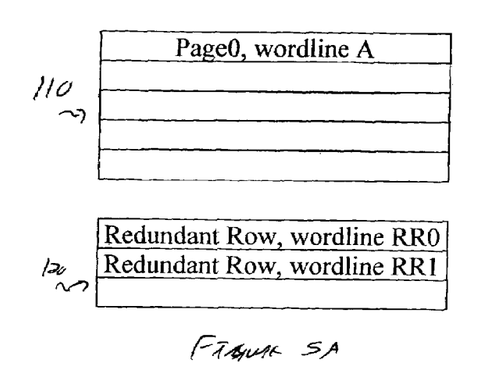
FIGS. 5A–5C are illustrations of a programming technique of a preferred embodiment in which an attempt is made to detect a defect on a word line that has just been programmed as well as a previously-programmed adjacent word line.
Figure 5B:
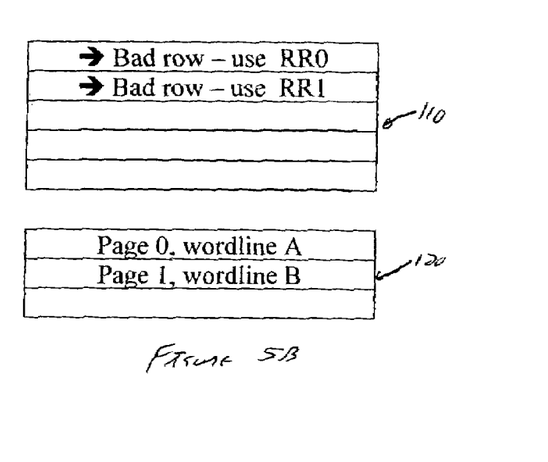
Figure 5C:
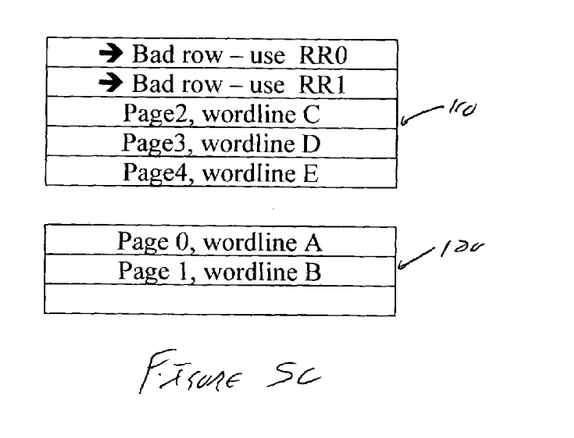

In yet another embodiment, instead of attempting to detect a defect on the word line that has just been programmed, the redundancy control logic 130 (designed with a sufficiently-large page buffer) can attempt to detect a defect on that word line as well as a previously-programmed adjacent word line. FIGS. 5A–5C illustrate this embodiment. In FIG. 5A, page 0 is programmed into word line A. As in the previous figures, even though word line A contains a defect, it cannot be detected because word line B has not yet been programmed. In FIG. 5B, page 1 is programmed into word line B. However, instead of reading back and comparing the information stored in word line B, both word lines A and B are read back and compared with corresponding information in the page buffer. This will detect the error not only in word line B but also the error in word line A, which is now detectable because of the short between word lines A and B. Both word lines are then repaired with redundant array word lines 150. The programming operation then continues with pages 2, 3, and 4 being successfully programmed into word lines C, D, and E, respectively, in the main array 110 (see FIG. 5C).

There are several alternatives that can be used with these preferred embodiments. For example, in the above embodiments, an attempt to detect a defect on a word line was made by reading back a word line and comparing its contents to information stored in a page register. Instead of using a separate read operation to determine if the contents of a word line match that of the page buffer on a word-line-by-word-line basis, the programmed/unprogrammed state of each memory cell can be sensed while attempting to program the memory cell. This sensing-while-programming technique is described in detail in U.S. Pat. No. 6,574,145, which is assigned to the assignee of the present invention and is hereby incorporated by reference. Also, in the embodiments described above, the redundancy control logic 130 provided on-the-fly redundancy/self-repair functionality. In an alternate embodiment, instead of having "on-chip" support for redundancy/self-repair, a host device in communication with the memory device is responsible for redundancy operations. Additionally, it should be noted that the "on-the-fly" self-repair functionality described above can be used either when the main array 110 is being programmed in the field (by an end user) or at the factory (such as when the main array 110 is being programmed with data or is being tested).

Further, the reprogramming can occur with exactly the same conditions or with different margin settings to tailor the reprogram conditions to margin out and thereby repair the memory cells affected by weak defects. The programming of the entire memory may result both in marginal 0's (cells that should be programmed to on-state) because there is a leakage that either reduces the effective voltage or the effective current on the selected bit or in marginal 1's (cells that should be unprogrammed in off-state) because there is a leakage on the selected bit or a bit line that increases the current on the selected bit. Marginal 0's can be detected with low read voltage and/or high read reference current. Marginal 1's can be detected with high read voltage and/or low read reference current. A default programming pass has margins for both 1's and 0's. It is therefore possible to achieve improved yield by simply programming the entire memory twice with the default 1's and 0's margin or by having a different margin for the two passes of programming steps.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for programming a memory array, the method comprising:
   (a) programming first and second word lines in a memory array, wherein the first word line comprises a defect that is detectable only after the second word line is programmed;
   (b) after each word line is programmed:
      (b1) attempting to detect a defect on that word line; and
      (b2) if a defect is detected, repairing that word line with a redundant word line; and
   (c) repeating (a) and (b), whereby the defect on the first word line is detected and the first word line is repaired the second time (a) and (b) are performed.

2. The method of claim 1, wherein the defect on the second word line is detected and the second word line is repaired the first time (a) and (b) are performed.

3. The method of claim 1, wherein the first word line is adjacent to the second word line in the memory array.

4. The method of claim 1, wherein the memory array comprise a plurality of write-once memory cells.

5. The method of claim 4, wherein the write-once memory cells comprises anti-fuse memory cells.

6. The method of claim 1, wherein the memory array comprises a three-dimensional memory array comprising a plurality of memory cell layers stacked vertically above one another above a single silicon substrate.

7. The method of claim 1, wherein (a) comprises programming first and second word lines and at least one additional word line in the memory array.

8. The method of claim 1, wherein (b1) comprises reading information stored in that word line and comparing the read information with information stored in a buffer.

9. A method for programming a memory array, the method comprising:
   (a) programming a plurality of word lines in a memory array; and
   (b) after each word line is programmed,
      (b1) attempting to detect a defect on that word line; and
      (b2) if a defect is detected, repairing that word line and a previously-programmed adjacent word line with redundant word lines, whereby the previously-programmed adjacent word line is repaired even though a defect on the previously-programmed adjacent word line was not detected after the previously-programmed adjacent word line was programmed.

10. The method of claim 9, wherein (b2) comprises if a defect is detected, repairing that word line, a previously-programmed adjacent word line, and a yet-to-be-programmed adjacent word line with redundant word lines.

11. The method of claim 9, wherein the memory array comprise a plurality of write-once memory cells.

12. The method of claim 11, wherein the write-once memory cells comprises anti-fuse memory cells.

13. The method of claim 9, wherein the memory array comprises a three-dimensional memory array comprising a plurality of memory cell layers stacked vertically above one another above a single silicon substrate.

14. The method of claim 9, wherein (b1) comprises reading information stored in that word line and comparing the read information with information stored in a buffer.

15. A method for programming a memory array, the method comprising:
   (a) programming a plurality of word lines in a memory array; and
   (b) after each word line is programmed,
      (b1) attempting to detect a defect on that word line and a previously-programmed adjacent word line; and
      (b2) if a defect is detected on that word line, repairing that word line and the previously-programmed adjacent word line with redundant word lines, whereby the previously-programmed adjacent word line is repaired even though a defect on the previously-programmed adjacent word line was not detected after the previously-programmed adjacent word line was programmed.

16. The method of claim 15, wherein the memory array comprise a plurality of write-once memory cells.

17. The method of claim 16, wherein the write-once memory cells comprises anti-fuse memory cells.

18. The method of claim 15, wherein the memory array comprises a three-dimensional memory array comprising a plurality of memory cell layers stacked vertically above one another above a single silicon substrate.

19. The method of claim 15, wherein (b1) comprises reading information stored in that word line and a previously-programmed adjacent word line and comparing the read information with information stored in a buffer.

* * * * *

UNITED STATES PATENT AND TRADEMARK OFFICE
CERTIFICATE OF CORRECTION

PATENT NO.         : 7,212,454 B2
APPLICATION NO. : 11/158396
DATED              : May 1, 2007
INVENTOR(S)        : Bendik Kleveland et al.

It is certified that error appears in the above-identified patent and that said Letters Patent is hereby corrected as shown below:

On the Title Page

In column 2, under "FOREIGN PATENT DOCUMENTS", insert
--WO          99/14763                  08/1998--.

Signed and Sealed this

Seventh Day of August, 2007

JON W. DUDAS
*Director of the United States Patent and Trademark Office*